US012651693B2

(12) United States Patent
Mikawa

(10) Patent No.: US 12,651,693 B2
(45) Date of Patent: Jun. 9, 2026

(54) COIL DEVICE, CIRCUIT ELEMENT MODULE, AND ELECTRONIC DEVICE

(71) Applicant: Murata Manufacturing Co., Ltd., Nagaokakyo (JP)

(72) Inventor: Kentaro Mikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1253 days.

(21) Appl. No.: 17/518,666

(22) Filed: Nov. 4, 2021

(65) Prior Publication Data

US 2022/0059279 A1 Feb. 24, 2022

Related U.S. Application Data

(63) Continuation of application No. PCT/JP2021/007850, filed on Mar. 2, 2021.

(30) Foreign Application Priority Data

Mar. 16, 2020 (JP) ................................. 2020-045287

(51) Int. Cl.
| | |
|---|---|
| *H01F 5/00* | (2006.01) |
| *H01F 27/29* | (2006.01) |
| *H01F 27/40* | (2006.01) |
| *H03H 7/38* | (2006.01) |

(52) U.S. Cl.
CPC ............. *H01F 27/29* (2013.01); *H01F 27/40* (2013.01); *H03H 7/38* (2013.01)

(58) Field of Classification Search
CPC ....................................................... H01F 27/29

USPC ......................................................... 336/200
See application file for complete search history.

(56) References Cited

U.S. PATENT DOCUMENTS

| | | | | |
|---|---|---|---|---|
| 2002/0105384 A1* | 8/2002 | Dent | .................... | H03H 7/1758 |
| | | | | 330/306 |
| 2002/0121957 A1* | 9/2002 | Takashima | .......... | H01F 17/0013 |
| | | | | 336/200 |
| 2010/0156194 A1 | 6/2010 | Navid et al. | | |
| 2011/0163824 A1 | 7/2011 | Kawano | | |
| 2011/0309994 A1 | 12/2011 | Kato et al. | | |
| 2012/0188047 A1* | 7/2012 | Groves | ............... | H01F 17/0013 |
| | | | | 336/200 |

(Continued)

FOREIGN PATENT DOCUMENTS

| | | |
|---|---|---|
| JP | 2011-159953 A | 8/2011 |
| JP | 2012-085251 A | 4/2012 |

(Continued)

OTHER PUBLICATIONS

Official Communication issued in International Patent Application No. PCT/JP2021/007850, mailed on May 11, 2021.

*Primary Examiner* — Ronald Hinson
(74) *Attorney, Agent, or Firm* — Keating & Bennett, LLP

(57) ABSTRACT

A low pass filter includes a first terminal pair, a second terminal pair, a first coil connected in series between the first terminal pair and the second terminal pair and including a first coil conductor wound around a winding axis, and a second coil connected in parallel between the first terminal pair and the second terminal pair, including a second coil conductor wound around the winding axis, magnetically coupled to the first coil. An area of the first coil conductor is larger than an area of the second coil conductor.

16 Claims, 11 Drawing Sheets

(56) References Cited

U.S. PATENT DOCUMENTS

| | | | |
|---|---|---|---|
| 2017/0133999 | A1 | 5/2017 | Ishizuka et al. |
| 2017/0213637 | A1* | 7/2017 | Vanukuru ........... H01F 17/0013 |
| 2020/0252041 | A1 | 8/2020 | Ishizuka |

FOREIGN PATENT DOCUMENTS

| | | | |
|---|---|---|---|
| JP | 2012-164928 | A | 8/2012 |
| JP | 2012-191596 | A | 10/2012 |
| WO | 2016/152603 | A1 | 9/2016 |
| WO | 2019/107081 | A1 | 6/2019 |

* cited by examiner

FIG. 1A
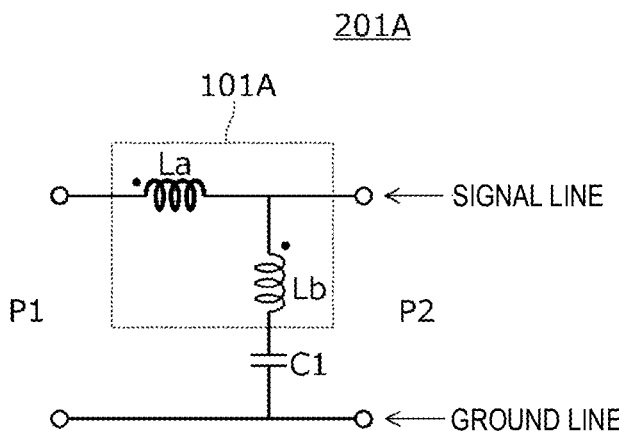
FIG. 1B
FIG. 2
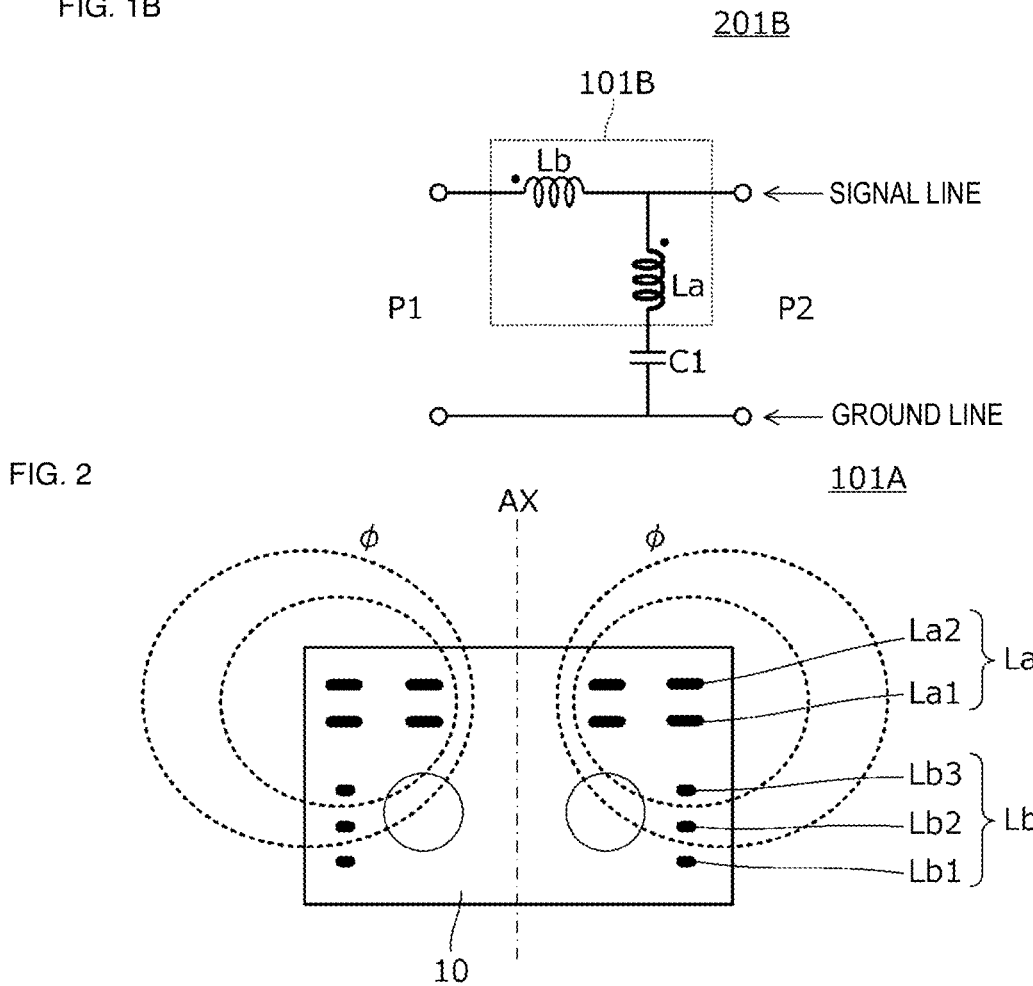

FIG. 12A
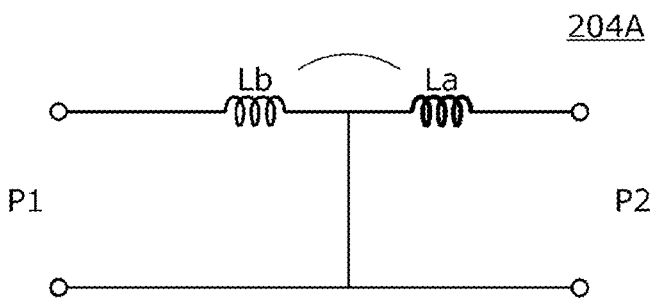
FIG. 12B
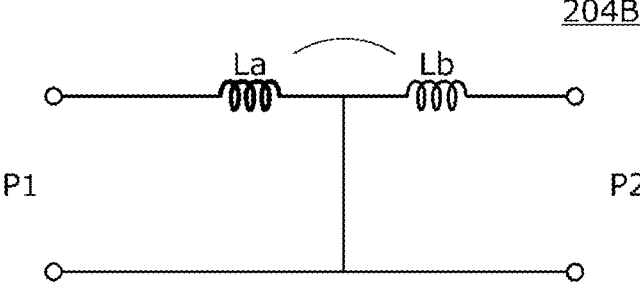
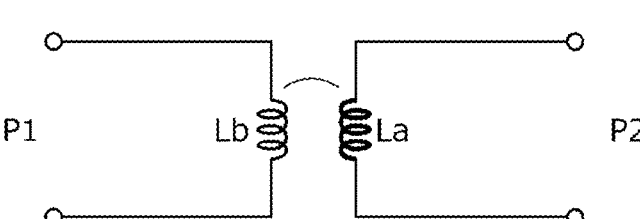
FIG. 12C
FIG. 12D
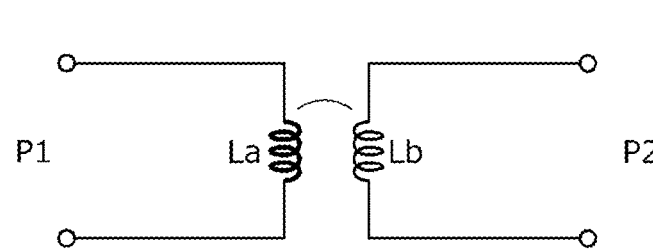

FIG. 13
205
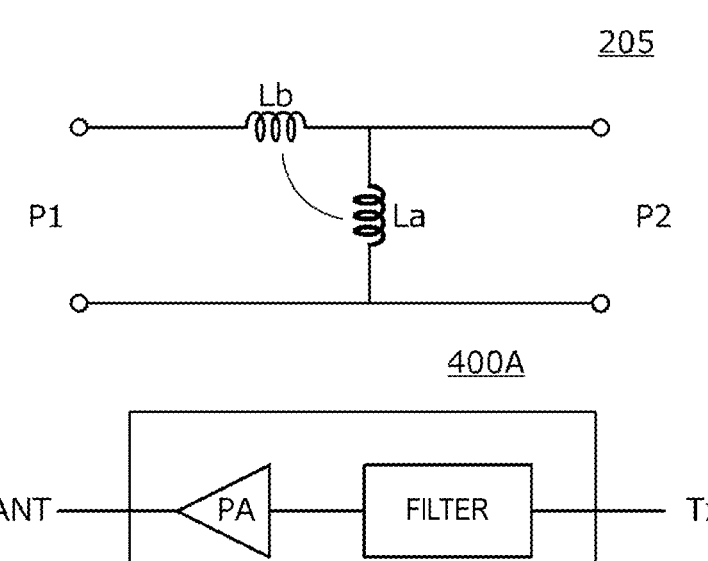
P1                                                    P2
FIG. 14A
400A
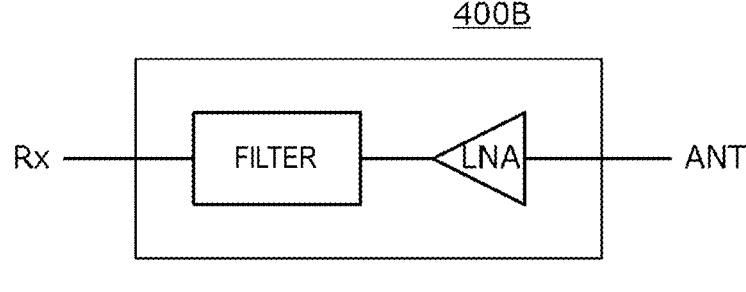
ANT —— PA —— FILTER —— Tx
FIG. 14B
400B
Rx —— FILTER —— LNA —— ANT
FIG. 15
500
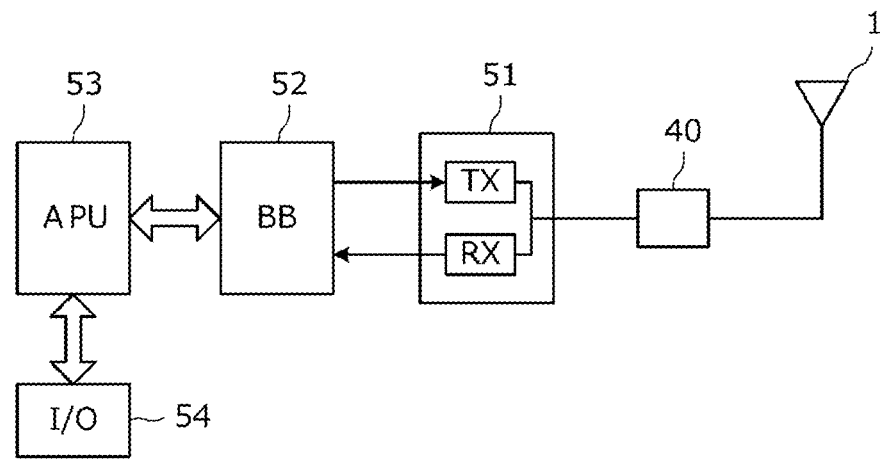

COIL DEVICE, CIRCUIT ELEMENT MODULE, AND ELECTRONIC DEVICE

CROSS REFERENCE TO RELATED APPLICATIONS

This application claims the benefit of priority to Japanese Patent Application No. 2020-045287 filed on Mar. 16, 2020 and is a Continuation Application of PCT Application No. PCT/JP2021/007850 filed on Mar. 2, 2021. The entire contents of each application are hereby incorporated herein by reference.

BACKGROUND OF THE INVENTION

1. Field of the Invention

The present invention relates to a coil device including multiple coils, a circuit element module including multiple coils and other circuit elements, and an electronic device including the coil device and/or the circuit element module.

2. Description of the Related Art

International Publication No. 2019/107081 discloses a filter circuit including two coils that are magnetically coupled to each other. For example, a low pass filter and a high pass filter are disclosed in International Publication No. 2019/107081, each of which includes an inductor connected in series to a signal line, an inductor shunt connected between the signal line and ground, and other circuit elements.

In the filter circuit described in International Publication No. 2019/107081, magnetic flux occurring from one coil, among the coils magnetically coupled to each other, may be disturbed by the existence of the other coil to inadvertently reduce the inductance of the one coil. Accordingly, it is necessary to adjust the number of turns and the coil length of the one coil in an increasing direction. In addition, eddy current may occur in the other coil and the eddy current may cause eddy current loss to cause loss. As a result, the Q value of the coils may be reduced to increase the insertion loss or reduce the attenuation, thus preventing desired filter characteristics from being achieved.

The characteristic change or shift caused by the reduction in the inductance and the reduction in the Q value does not only occur in the filter and commonly occurs in a coil device and a circuit element module, which include multiple coils magnetically coupled to each other.

SUMMARY OF THE INVENTION

Preferred embodiments of the present invention provide coil devices, circuit element modules, and electronic devices each including a coil device and/or a circuit element module, in each of which a reduction in an inductance and a reduction in a Q value are reduced or prevented even with multiple coils magnetically coupled to each other and each of which have certain characteristics.

A coil device according to a preferred embodiment of the present invention includes a first terminal pair, a second terminal pair, a first coil connected in series between the first terminal pair and the second terminal pair and including a first coil conductor wound around a winding axis, and a second coil connected in parallel between the first terminal pair and the second terminal pair, including a second coil conductor wound around the winding axis, and magnetically coupled to the first coil. An area of the first coil conductor is larger than an area of the second coil conductor when the coil device is viewed in the direction of the winding axis.

A coil device according to a preferred embodiment of the present invention includes a first terminal pair, a second terminal pair, a first coil connected in parallel between the first terminal pair and the second terminal pair and including a first coil conductor wound around a winding axis, and a second coil connected in series between the first terminal pair and the second terminal pair, including a second coil conductor wound around the winding axis, and magnetically coupled to the first coil. A coil opening of the first coil is larger than a coil opening of the second coil when the coil device is viewed in the direction of the winding axis.

A coil device according to a preferred embodiment of the present invention includes a first terminal pair, a second terminal pair, a first coil connected between the terminals of the first terminal pair and including a first coil conductor wound around a winding axis, and a second coil connected between the terminals of the second terminal pair, including a second coil conductor wound around the winding axis, and magnetically coupled to the first coil. An inductance of the first coil is lower than an inductance of the second coil. An area of the first coil conductor is larger than an area of the second coil conductor when the coil device is viewed in the direction of the winding axis.

According to preferred embodiments of the present invention, coil devices, circuit element modules, and electronic devices each including a coil device and/or a circuit element module are provided, in each of which a reduction in the inductance and a reduction in the Q value are reduced or prevented even with multiple coils magnetically coupled to each other and each of which have certain characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a circuit diagram of a low pass filter 201A according to a first preferred embodiment and FIG. 1B is a circuit diagram of a low pass filter 201B according to the first preferred embodiment of the present invention.

FIG. 2 is a cross-sectional view of a main portion of the coil device 101A.

FIGS. 12A to 12D are circuit diagrams of impedance transformers 204A, 204B, 204C, and 204D according to a fourth preferred embodiment of the present invention, respectively.

FIG. 13 is a circuit diagram of an impedance transformer 205 according to a fifth preferred embodiment of the present invention.

FIGS. 14A and 14B are block diagrams of radio-frequency modules according to a sixth preferred embodiment of the present invention, respectively.

FIG. 15 is a block diagram of an electronic device 500 according to a seventh preferred embodiment of the present invention.

DETAILED DESCRIPTION OF THE PREFERRED EMBODIMENTS

Figure 3:
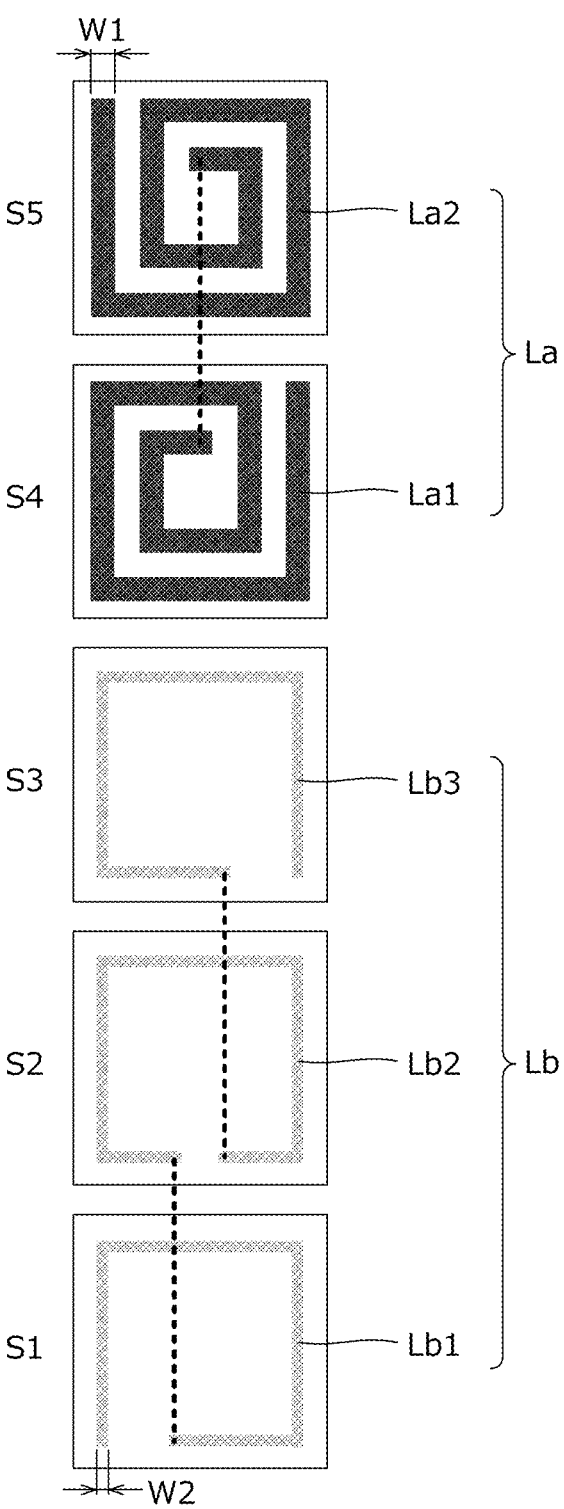
FIG. 3 is an exploded plan view illustrating conductor patterns provided on the respective layers of a multilayer body 10 of the coil device 101A.

Preferred embodiments of the present invention will herein be described with reference to the drawings using several specific examples. The same reference numerals and letters are used for the same or corresponding components in the respective drawings. Although the preferred embodiments are described for convenience of description in consideration of description of the points or easiness of understanding, partial replacement or combination of the components described in different preferred embodiments is also included. A description of matters common to a first preferred embodiment is omitted and only points different from the first preferred embodiment are described in a second preferred embodiment and subsequent preferred embodiments. In particular, the same or substantially the same advantageous effects of the same components are not successively described in the respective preferred embodiments.

First Preferred Embodiment

A coil device having a low pass filter function will be exemplified in a first preferred embodiment of the present invention.

FIG. 1A is a circuit diagram of a low pass filter 201A according to the first preferred embodiment. FIG. 1B is a circuit diagram of a low pass filter 201B according to the first preferred embodiment.

The low pass filter 201A illustrated in FIG. 1A and the low pass filter 201B illustrated in FIG. 1B each define and function as a low pass filter including a first terminal pair P1 as an input unit and a second terminal pair P2 as an output unit.

The configuration including the first terminal pair and the second terminal pair does not necessarily include four terminals. One terminal of the first terminal pair may be physically common to one terminal of the second terminal pair or a common terminal may be included in the first terminal pair and the second terminal pair.

The low pass filter 201A includes a coil device 101A and the low pass filter 201B includes a coil device 101B. Each of the coil devices 101A and 101B includes a first coil La and a second coil Lb.

The low pass filter 201A includes the first coil La connected in series between the first terminal pair P1 and the second terminal pair P2 and the second coil Lb connected in parallel between the first terminal pair P1 and the second terminal pair P2. A capacitor C1 is connected in series to the second coil Lb. A series circuit including the second coil Lb and the capacitor C1 is shunt connected between a signal line and ground.

The low pass filter 201B includes the second coil Lb connected in series between the first terminal pair P1 and the second terminal pair P2 and the first coil La connected in parallel between the first terminal pair P1 and the second terminal pair P2. The capacitor C1 is connected in series to the first coil La. A series circuit including the first coil La and the capacitor C1 is shunt connected between the signal line and the ground.

Figure 4:
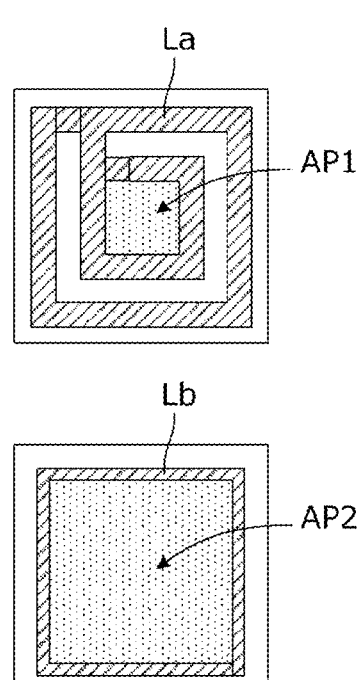
FIG. 4 is a diagram illustrating plane patterns of a first coil La and a second coil Lb.

FIG. 2 is a cross-sectional view of the main portion of the coil device 101A. FIG. 3 is an exploded plan view illustrating conductor patterns provided on the respective layers of a multilayer body 10 including the coil device 101A. FIG. 2 is a cross-sectional view at a position along a coil winding axis AX of the first coil La and the second coil Lb. Referring to FIG. 3, broken lines indicate the positions of interlayer connection conductors. FIG. 4 is a diagram illustrating plane patterns of the first coil La and the second coil Lb.

In the multilayer body 10, first coil conductors La1 and La2 provided across an S4 layer and an S5 layer of the first coil La, and second coil conductors Lb1, Lb2, and Lb3 provided across an S1 layer to an S3 layer define the second coil Lb.

The first coil conductors La1 and La2 and the second coil conductors Lb1, Lb2, and Lb3 are conductor patterns wound around the common coil winding axis AX. A coil opening AP1 of the first coil La includes a portion overlapped with a coil opening AP2 of the second coil Lb. With this structure, the first coil La is magnetically coupled to the second coil Lb.

The coil device 101B has a configuration the same as or similar to that of the coil device 101A. In the coil device 101B, the first coil La is a coil having a Q value higher than that of the second coil Lb.

The characteristic configurations of the first coil La, the second coil Lb, the first coil conductors La1 and La2, and the second coil conductors Lb1, Lb2, and Lb3 are as follows:

(a) When the coil device 101A is viewed in the direction of the coil winding axis AX, the area of a pattern in which the first coil conductors La1 and La2 are overlapped with each other, that is, the area of a hatched portion of the first coil La in FIG. 4 (a portion excluding the coil opening AP1 and coil conductor spacing of the first coil La) is larger than the area of a pattern in which the second coil conductors Lb1, Lb2, and Lb3 are overlapped with each other, that is, the area of a hatch portion of the second coil Lb in FIG. 4 (a portion that does not include the coil opening AP2 of the second coil Lb).

(b) When the coil device 101A is viewed in the direction of the coil winding axis AX, the coil opening AP1 of the first coil La is smaller than the coil opening AP2 of the second coil Lb.

(c) A line width W1 of the first coil conductors La1 and La2 is greater than a line width W2 of the second coil conductors Lb1, Lb2, and Lb3.

(d) The first coil conductors La1 and La2 each have a rectangular or substantially rectangular spiral shape and the second coil Lb has a rectangular or substantially rectangular helical shape. The outer perimeter of the first coil La has the same or substantially the same size as the outer perimeter of the second coil Lb. Here, the "spiral shape" means a state in which the coil conductor is formed around the coil winding axis on a two-dimensional plane and the "helical shape" means a state in which the coil conductor is formed in a three-dimensional area around the coil winding axis.

With the configuration in (a) or the configuration in (b) described above, magnetic flux φ passing through the coil opening AP1 of the first coil La is less likely to be influenced by the second coil conductors Lb1, Lb2, and Lb3. In other words, eddy current is unlikely to occur, which is caused by impingement of the magnetic flux φ passing through the coil opening AP1 of the first coil La on the second coil conductors Lb1, Lb2, and Lb3. In addition, since the magnetic flux φ passing through the coil opening AP1 of the first coil La is less likely to be influenced by the second coil conductors Lb1, Lb2, and Lb3, a reduction in inductance of the first coil La is reduced or prevented. Accordingly, it is not necessary to adjust the inductance by increasing the number of turns and the coil diameter of the first coil La and the Q value of the first coil La is maintained high.

Although the magnetic flux φ passing through the coil opening AP1 of the first coil La is influenced by the second coil conductors, for example, if the second coil conductors exist at positions drawn by solid-line circles in FIG. 2, the magnetic flux φ passing through the coil opening AP1 of the first coil La is not influenced by the second coil conductors in the present preferred embodiment.

With the configuration in (c) described above, a direct current resistance component DCR of the first coil conductors La1 and La2 is decreased to increase the Q value of the first coil La.

With the configuration in (d) described above, the magnetic flux φ passing through the coil opening AP1 of the first coil La is even less likely to be influenced by the second coil conductors Lb1, Lb2, and Lb3 and the first coil La has a high Q value.

In the coil device 101A used in the low pass filter 201A illustrated in FIG. 1A, larger current flows through the first coil La in a frequency band (pass frequency band), which is a passband on the frequency axis, compared with the current in other frequency bands. Accordingly, heat loss caused by the resistance component of the first coil La in the pass frequency band is reduced or prevented so as to reduce insertion loss.

In contrast, in the coil device 101B used in the low pass filter 201B illustrated in FIG. 1B, larger current flows through the first coil La in a frequency band (attenuation-pole frequency band) near an attenuation pole on the frequency axis, compared with the current in other frequency bands, due to resonance caused by the series circuit of the first coil La and the capacitor C1. Accordingly, a reduction in attenuation caused by the resistance component of the first coil La in the attenuation-pole frequency band is reduced or prevented to increase the attenuation.

Figure 5A:
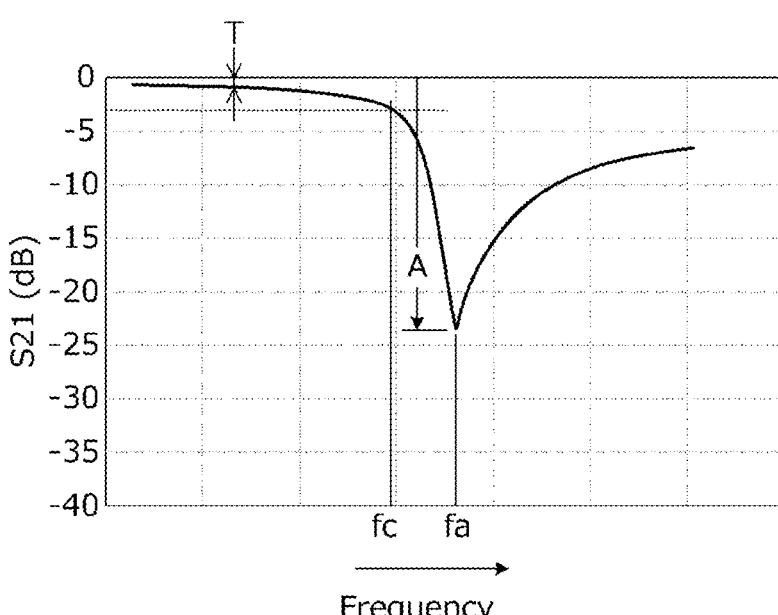
FIG. 5A is a graph indicating a frequency characteristic of a transmission coefficient S21 from a first terminal pair P1 to a second terminal pair P2 in the low pass filter 201A illustrated in FIG. 1A
Figure 5B:
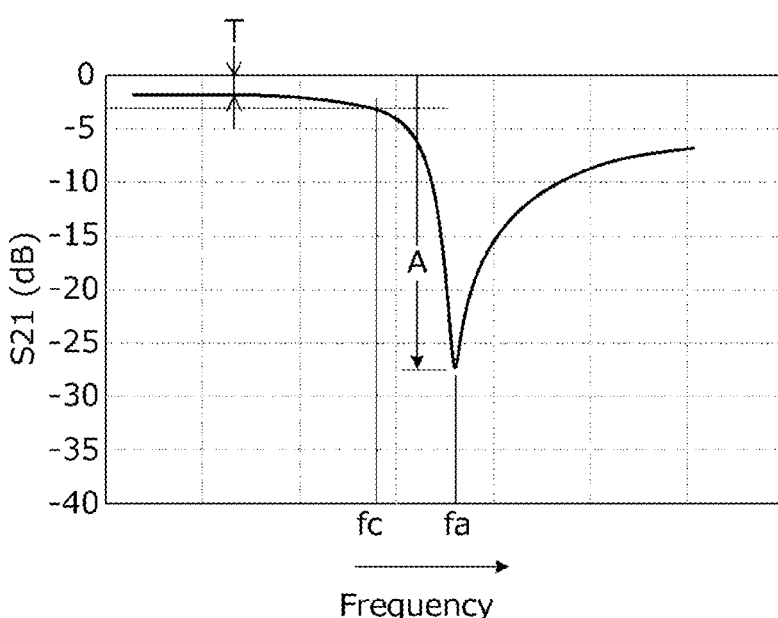
FIG. 5B is a graph indicating a frequency characteristic of the transmission coefficient S21 from the first terminal pair P1 to the second terminal pair P2 in the low pass filter 201B illustrated in FIG. 1B.

FIG. 5A is a graph indicating a frequency characteristic of the transmission coefficient S21 from the first terminal pair P1 to the second terminal pair P2 in the low pass filter 201A illustrated in FIG. 1A. FIG. 5B is a graph indicating a frequency characteristic of the transmission coefficient S21 from the first terminal pair P1 to the second terminal pair P2 in the low pass filter 201B illustrated in FIG. 1B. Referring to FIGS. 5A and 5B, fa denotes an attenuation-pole frequency. Here, a frequency band lower than a frequency fc at which S21 is about −3 dB (passing power is halved) is the pass frequency band and a frequency band higher than the frequency fc is the attenuation-pole frequency band.

As described above, the low pass filter 201A has smaller insertion loss in the pass frequency band. The low pass filter 201A has smaller insertion loss T in the pass frequency band, compared with the characteristic of the low pass filter 201B illustrated in FIG. 1B.

The low pass filter 201B has higher attenuation in the attenuation-pole frequency band. The low pass filter 201B has higher attenuation A in the attenuation-pole frequency band, compared with the characteristic of the low pass filter 201A illustrated in FIG. 1A.

The filter taking the advantage of a higher Q value is provided by allocating the coil having the higher Q value depending on desired filter characteristics in the above manner.

Second Preferred Embodiment

A coil device having a high pass filter function will be exemplified in a second preferred embodiment of the present invention.

Figure 6A:
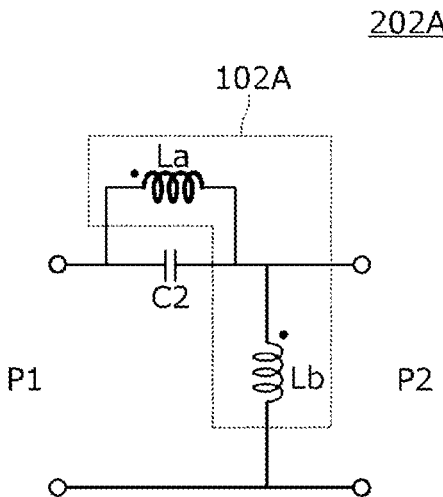
FIG. 6A is a circuit diagram of a high pass filter 202A according to a second preferred embodiment and FIG. 6B is a circuit diagram of a high pass filter 202B according to the second preferred embodiment of the present invention.
Figure 6B:
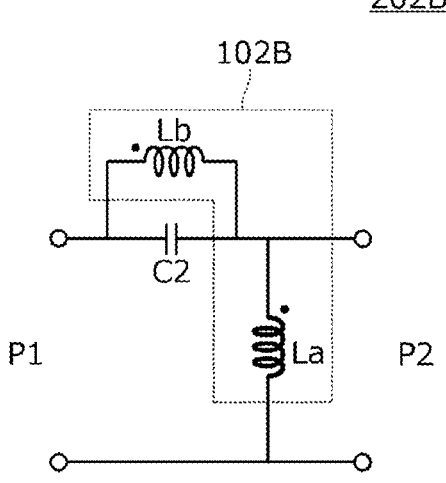

FIG. 6A is a circuit diagram of a high pass filter 202A according to the second preferred embodiment. FIG. 6B is a circuit diagram of a high pass filter 202B according to the second preferred embodiment.

The high pass filter 202A illustrated in FIG. 6A and the high pass filter 202B illustrated in FIG. 6B each define and function as a high pass filter using the first terminal pair P1 as the input unit and the second terminal pair P2 as the output unit.

The high pass filter 202A includes a coil device 102A and the high pass filter 202B includes a coil device 102B. Each of the coil devices 102A and 102B includes the first coil La and the second coil Lb and has the structure illustrated in FIG. 2 and FIG. 3.

The high pass filter 202A includes the first coil La connected in series between the first terminal pair P1 and the second terminal pair P2 and the second coil Lb shunt connected between the signal line and the ground between the first terminal pair P1 and the second terminal pair P2. A capacitor C2 is connected in parallel to the first coil La. A parallel circuit including the first coil La and the capacitor C2 is connected in series to the signal line.

The high pass filter 202B includes the second coil Lb connected in series between the first terminal pair P1 and the second terminal pair P2 and the first coil La shunt connected between the signal line and the ground between the first terminal pair P1 and the second terminal pair P2. The capacitor C2 is connected in parallel to the second coil Lb. A parallel circuit including the second coil Lb and the capacitor C2 is connected in series to the signal line.

In each of the coil devices 102A and 102B, the Q value of the first coil La is higher than the Q value of the second coil Lb.

In the high pass filter 202A, the attenuation pole is in the frequency band (attenuation-pole frequency band) near the attenuation pole on the frequency axis due to the resonance caused by the parallel circuit of the first coil La and the capacitor C2. Since the conductance component equivalently appears in the parallel circuit near the resonance due to the resistance component of the first coil La, current passing through the parallel circuit also occurs in the resonance state and power is transmitted between the first terminal pair P1 and the second terminal pair P2 to reduce the attenuation. However, since the Q value of the first coil La is high in the high pass filter 202A, the reduction in the attenuation due to the resistance component of the first coil La in the attenuation-pole frequency band is reduced or prevented to increase the attenuation.

In contrast, in the high pass filter 202B, the insertion loss in the passband occurs in the frequency band (pass frequency band), which is the passband on the frequency axis, due to a shift in phase from an ideal inductor caused by the resistance component of the first coil La. However, since the Q value of the first coil La is high in the high pass filter 202B, the shift in phase caused by the resistance component of the first coil La in the pass frequency band is small to reduce the insertion loss.

In addition, the attenuation is decreased in a frequency band (cutoff frequency band), which is a stopband on the frequency axis, due to the resistance component of the first coil La. However, since the Q value of the first coil La is high in the high pass filter 202B, the reduction in the attenuation due to the resistance component of the first coil La in the cutoff frequency band is reduced or prevented to increase the attenuation.

Figure 7A:
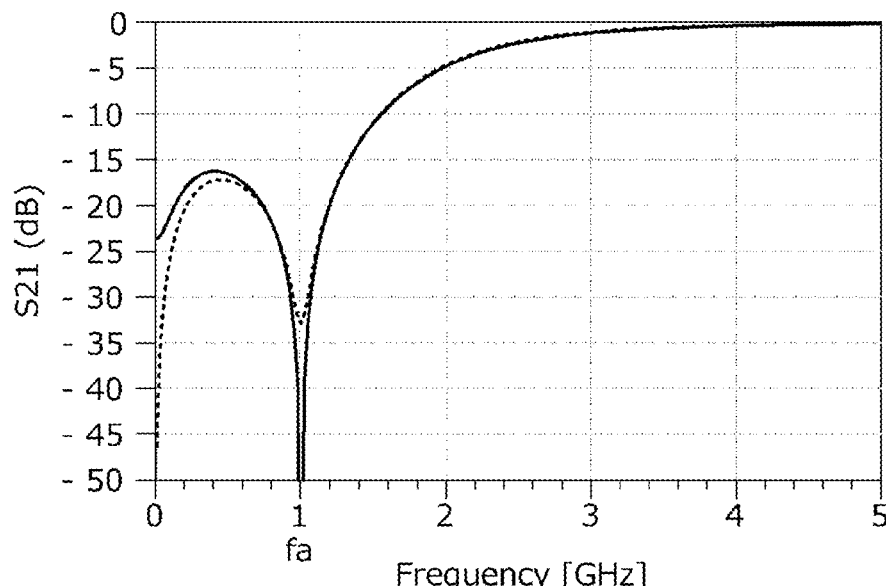
FIG. 7A is a graph indicating a frequency characteristic of the transmission coefficient S21 from the first terminal pair P1 to the second terminal pair P2 in the high pass filters 202A and 202B illustrated in FIG. 6A and FIG. 6B
Figure 7B:
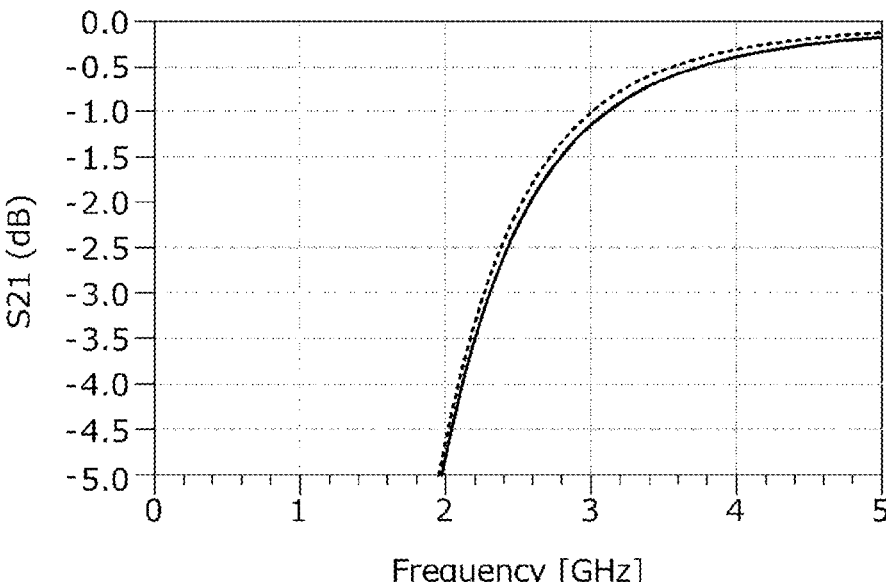
FIG. 7B is a graph resulting from enlargement of the vertical axis (insertion loss) in FIG. 7A.

FIG. 7A is a graph indicating a frequency characteristic of the transmission coefficient S21 from the first terminal pair P1 to the second terminal pair P2 in the high pass filters 202A and 202B illustrated in FIGS. 6A and 6B. FIG. 7B is a graph resulting from enlargement of the vertical axis (the insertion loss) in FIG. 7A. Referring to FIGS. 7A and 7B, a solid line indicates a characteristic of the high pass filter 202A and a broken line indicates a characteristic of the high pass filter 202B. Referring to FIG. 7A, fa denotes the attenuation-pole frequency.

As described above, in the high pass filter 202A, since the Q value of the first coil La connected in series is high, the attenuation in the attenuation-pole frequency band is high, compared with the characteristic of the high pass filter 202B.

In contrast, in the high pass filter 202B, since the Q value of the first coil La connected in parallel is high, the insertion loss in the pass frequency band is reduced, as indicated in FIG. 7B. In addition, the attenuation in the stopband excluding the attenuation pole (a frequency band lower than the attenuation pole frequency fa) is high, as indicated in FIG. 7A.

The filter taking the advantage of a higher Q value is provided by allocating the coil having the higher Q value depending on desired filter characteristics in the above manner.

Third Preferred Embodiment

Another coil device having the low pass filter function will be exemplified in a third preferred embodiment of the present invention.

Figure 8A:
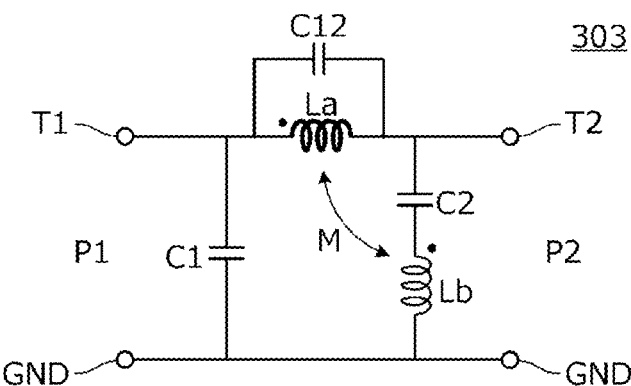
FIG. 8A is a circuit diagram of a circuit element module 303 according to a third preferred embodiment of the present invention.
Figure 8B:
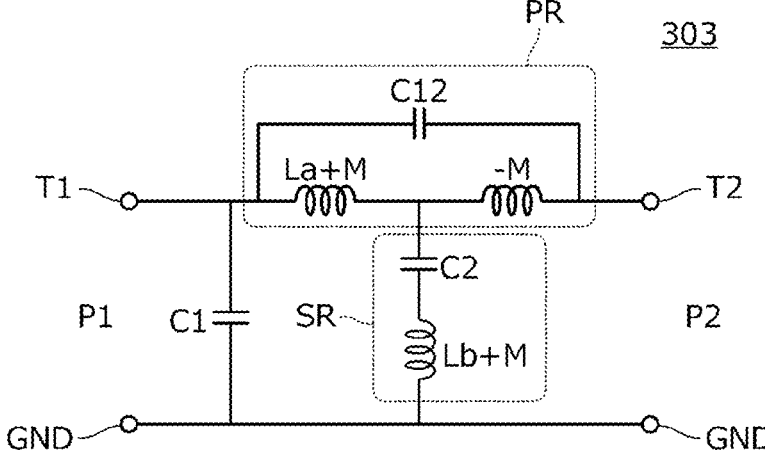
FIG. 8B is an equivalent circuit diagram of the circuit element module 303.
Figure 8C:
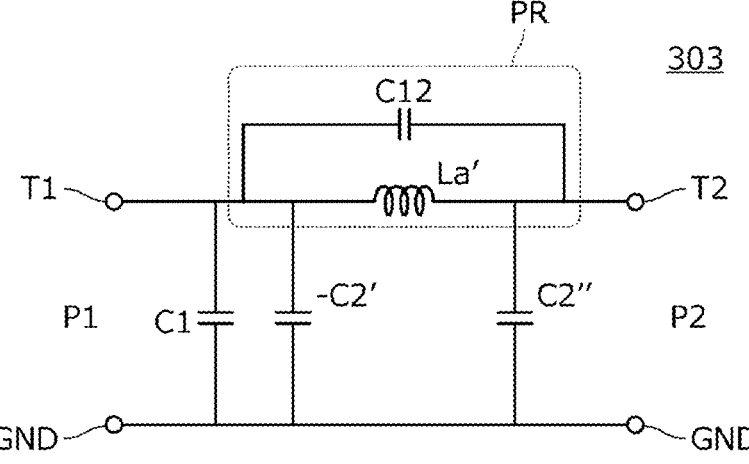
FIG. 8C is another equivalent circuit diagram of the circuit element module 303.

FIG. 8A is a circuit diagram of a circuit element module 303 according to the third preferred embodiment. FIG. 8B is an equivalent circuit diagram of the circuit element module 303. FIG. 8C is another equivalent circuit diagram of the circuit element module 303. The circuit element module 303 functions as a low pass filter.

The circuit element module 303 includes the first coil La, the second coil Lb, and other circuit elements connected to the first coil La or the second coil Lb. The circuit element module 303 includes the first coil La connected in series between the first terminal pair P1 and the second terminal pair P2 and the second coil Lb coupled between the first terminal pair P1 and the second terminal pair P2.

A capacitor C12 is connected in parallel to the first coil La. A parallel circuit composed of the first coil La and the capacitor C12 is connected in series to the signal line. The capacitor C2 is connected in series to the second coil Lb. A series circuit including the second coil Lb and the capacitor C2 is shunt connected between the signal line and the ground. In addition, the capacitor C1 is shunt connected between the signal line and the ground (is connected to both ends of the first terminal pair P1) upstream of the parallel circuit of the first coil La and the capacitor C12.

A transformer provided by the coupling between the first coil La and the second coil Lb is represented by a T-shaped equivalent circuit, as illustrated in FIG. 8B, where the mutual inductance of the first coil La and the second coil Lb is denoted by M. The first coil La is cumulatively connected to the second coil Lb. Accordingly, a parallel resonant circuit PR includes a parallel circuit of inductors (La+M, −M) and the capacitor C12 and a series resonant circuit SR includes a series circuit of an inductor (Lb+M) and the capacitor C2 in FIG. 8B. The parallel resonant circuit PR and the series resonant circuit SR compositely cause a first attenuation pole and a second attenuation pole. The capacitor C1 defines and functions as a matching circuit.

The two attenuation poles are caused by the capacitor C12 in the present preferred embodiment, compared with the coil device having the low pass filter function described in the first preferred embodiment. Accordingly, a deep attenuation characteristic is achieved in each of the two bands or a deep attenuation characteristic is achieved over a wide band.

Although the inductor (La+M), the inductor (−M), the inductor (Lb+M), and the capacitor C2 define the T-shaped circuit in FIG. 8B, the sharpness of the attenuation characteristic of the low pass filter is slightly reduced because the inductor (−M) has a negative reactance. However, conversion of the T-shaped circuit into a pi-shaped circuit in the passband of the low pass filter results in an equivalent circuit illustrated in FIG. 8C because the inductor (−M) has a negative reactance. Specifically, the pi-shaped circuit including capacitors −C2' and C2" and an inductor La' illustrated in FIG. 8C is equivalent to the T-shaped circuit illustrated in Fig. B. As described above, negative susceptance occurs due to the negative capacitance C2' shunt connected to the first terminal pair P1 side. Since the capacitor C1 is connected in parallel to the negative susceptance, the negative susceptance is reduced or prevented. Accordingly, degradation of the sharpness of the attenuation characteristic as the low pass filter is reduced or prevented. In other words, the addition of the capacitor C1 achieves the sharper attenuation characteristic, compared with the coil device having the low pass filter function in the first preferred embodiment.

Figures 9, 10:
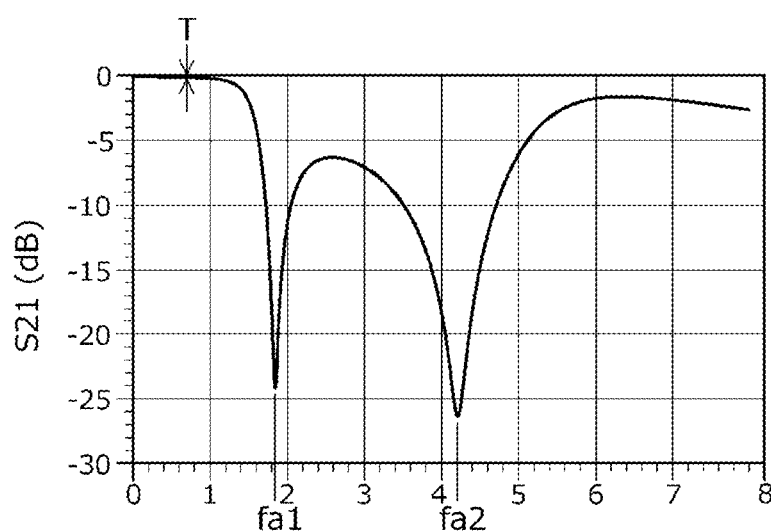
FIG. 9 is a graph indicating a frequency characteristic of the transmission coefficient S21 from the first terminal pair P1 to the second terminal pair P2 in the circuit element module 303.
FIG. 10 is a perspective view of conductor patterns in the circuit element module 303.

FIG. 9 is a graph indicating a frequency characteristic of the transmission coefficient S21 from the first terminal pair P1 to the second terminal pair P2 in the circuit element module 303. A frequency fa1 is the frequency of the first attenuation pole and a frequency fa2 is the frequency of the second attenuation pole. Since the Q value of the first coil La is high in this example, the insertion loss T in the pass frequency band is small. In addition, the occurrence of the mutual inductance increases the apparent inductance of the first coil La and also increases the apparent Q value of the first coil La to decrease the insertion loss T in the pass frequency band.

In other words, with the circuit element module 303 of the present preferred embodiment, it is possible to decrease the insertion loss T in the pass frequency band.

Figure 11:
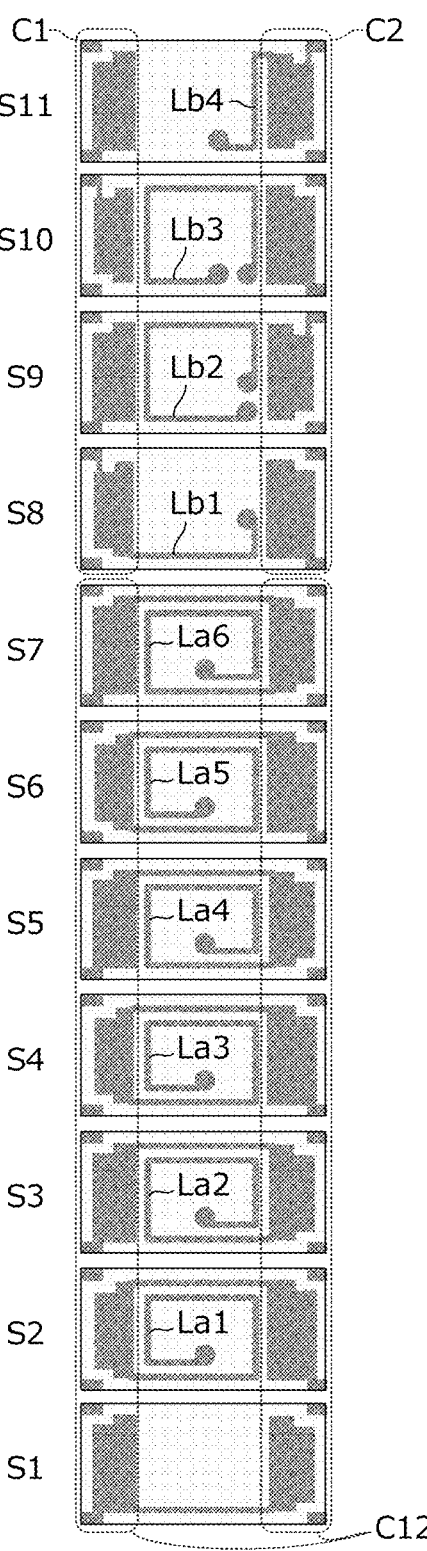
FIG. 11 is an exploded plan view illustrating the conductor patterns of the respective layers of the circuit element module 303.

FIG. 10 is a perspective view of conductor patterns in the circuit element module 303. FIG. 11 is an exploded plan view illustrating the conductor patterns of the respective layers of the circuit element module 303. Terminals T1, T2, and GND in FIG. 10 correspond to the terminals T1, T2, and GND illustrated in FIGS. 8A and 8B, respectively. A terminal NC in FIG. 10 is a free terminal that is not connected to the circuit.

Referring to FIG. 11, first coil conductors La1 to La6 provided across an S2 layer to an S7 layer define the first coil La, and second coil conductors Lb1 to Lb4 provided across an S8 layer to an S11 layer define the second coil Lb. The first coil conductors La1 to La6 are connected in parallel to each other and the second coil conductors Lb1 to Lb4 are connected in series to each other. Electrodes provided across an S1 layer to the S7 layer define the capacitor C12. In addition, electrodes provided across the S8 layer to the S11 layer define the capacitors C1 and C2.

The advantageous effects of the circuit element module 303 configured in the above manner are described below.

(a) Since providing the capacitors C1, C2, and C12 alongside the first coil La and the second coil Lb reduces or prevents the coil openings of the first coil La and the second coil Lb from being overlapped with the electrodes of the capacitors C1, C2, and C12, the reductions in the inductances and the Q values of the first coil La and the second coil Lb are reduced or prevented.

(b) Since providing the capacitors C1, C2, and C12 alongside the first coil La and the second coil Lb increases the number of laminated layers of the electrodes of the capacitors C1, C2, and C12, the ratio of the areas outside the top and bottom layers that do not contribute to the formation of the capacitors is decreased to increase the capacitance per volume.

(c) Since providing the capacitors C1, C2, and C12 alongside the first coil La and the second coil Lb increases the number of laminated layers of the electrodes of the capacitors C1, C2, and C12, the interlayer thicknesses are averaged to reduce or prevent a variation in capacitance caused by a variation in the interlayer thickness and also to reduce or prevent a variation in the resonant frequency.

(d) Since providing the capacitor C12 alongside the first coil La (integrating the first coil La with the capacitor C12) makes the coil opening of the first coil La large without obstructing the coil opening by the electrodes of the capacitor C12 and makes the line width thick, the Q value of the first coil La is improved. However, the line width of the first coil conductors La1 to La6 is equal or substantially equal to the line width of the second coil conductors Lb1 to Lb4 in the example illustrated in FIG. 11.

(e) Providing the capacitor C12 alongside the first coil La (integrating the first coil La with the capacitor C12) eliminates the necessity of providing a gap layer between the first coil La and the capacitor C12 to increase the inductance of the first coil La and the capacitance of the capacitor C12 per volume.

(f) The spiral shape of each of the first coil conductors La1 to La6 and the parallel connection and the magnetic coupling between the first coil conductors La1 to La6 increase the equivalent thickness of the coil conductors of the first coil La to improve the Q value while maintaining the inductance of the first coil La.

(g) Connecting the first coil conductors La1 to La6 in parallel on the adjacent layers eliminates the necessity of providing the interlayer connection conductors for the capacitor C12. In addition, by not providing the interlayer connection conductors the effective areas of the electrodes of the capacitor C12 can be increased to increase the capacitance of the capacitor C12.

(h) Configuring the second coil Lb into a helical shape decreases the line width of the second coil Lb opposed to the first coil La causing the eddy current to reduce or prevent the reductions in the inductance and the Q value of the first coil La and the increase in the insertion loss.

(i) Providing the capacitors C1, C2, and C12 alongside the first coil La and the second coil Lb enables the second coil Lb to be extended through the electrodes of the capacitor C1 and the capacitor C2 to adjust the line length of the second coil Lb without changing the coil opening of the second coil Lb. This enables the reduction in the Q value to be reduced or prevented to adjust the inductance of the second coil Lb, thus adjusting the resonant frequency.

(j) The coupling coefficient between the first coil La and the second coil Lb is capable of being adjusted depending on a method of determining the positions of the interlayer connection conductors near the beginning of winding and the end of winding of the second coil Lb to adjust the resonant frequency of the series resonant circuit SR. For example, decreasing the second coil conductor Lb4 and increasing the second coil conductor Lb1 in length enables the coupling coefficient to be increased while maintaining or substantially maintaining the inductance of the second coil Lb. In contrast, increasing the second coil Lb4 and decreasing the second coil conductor Lb1 in length enables the coupling coefficient to be decreased while maintaining or substantially maintaining the inductance of the second coil Lb. In other words, increasing the line length of the boundary between the second coil conductor Lb1 and the first coil conductor La6 increases the coupling coefficient between the first coil La and the second coil Lb while decreasing the line length of the boundary between the second coil conductor Lb1 and the first coil conductor La6 decreases the coupling coefficient between the first coil La and the second coil Lb.

Fourth Preferred Embodiment

A coil device defining and functioning as an impedance transformer will be exemplified in a fourth preferred embodiment of the present invention.

FIGS. 12A to 12D are circuit diagrams of impedance transformers 204A, 204B, 204C, and 204D according to the fourth preferred embodiment, respectively. Each of the impedance transformers 204A, 204B, 204C, and 204D includes the first coil La and the second coil Lb. The first coil La is magnetically coupled to the second coil Lb.

The coil having low inductance is required to have a small resistance component to maintain the Q value of the coil. However, since the inductance is increased in the first to second power (ideal) of the number of turns while the resistance component is varied in only the first power thereof, it is difficult to maintain the Q value of the coil having low inductance.

In the impedance transformer 204A in FIG. 12A, the second coil Lb is connected to the first terminal pair P1 and the first coil La is connected to the second terminal pair P2. The impedance transformation ratio of the impedance transformer 204A is Nb:Na where the number of turns of the second coil Lb is denoted by Nb and the number of turns of the first coil La is denoted by Na. In this example, Nb>Na and the impedance transformation ratio from the first terminal pair P1 to the second terminal pair P2 is lower than one. Since the Q value of the first coil La, in which it is difficult to have a high Q value because of low inductance, is set to a value equal or substantially equal to the Q value of the second coil Lb in the impedance transformer 204A, it is possible to use the impedance transformer 204A as an impedance transformer with low insertion loss.

In the impedance transformer 204B in FIG. 12B, the first coil La is connected to the first terminal pair P1 and the second coil Lb is connected to the second terminal pair P2. The impedance transformation ratio of the impedance transformer 204B is Na:Nb where the number of turns of the second coil Lb is denoted by Nb and the number of turns of the first coil La is denoted by Na. In this example, Na<Nb and the impedance transformation ratio from the first terminal pair P1 to the second terminal pair P2 exceeds one. Since the Q value of the first coil La, in which it is difficult to have a high Q value because of low inductance, is set to a value nearly equal to the Q value of the second coil Lb also in the impedance transformer 204B, it is possible to use the impedance transformer 204B as an impedance transformer with low insertion loss.

In the impedance transformer 204C in FIG. 12C, the second coil Lb is connected to the first terminal pair P1 and the first coil La is connected to the second terminal pair P2. The impedance transformer 204A illustrated in FIG. 12A is an unbalanced circuit while the impedance transformer 204C illustrated in FIG. 12C is a balanced circuit. The impedance transformation ratio of the impedance transformer 204C is Nb:Na where the number of turns of the second coil Lb is denoted by Nb and the number of turns of the first coil La is denoted by Na. In this example, Nb>Na and the impedance transformation ratio from the first terminal pair P1 to the second terminal pair P2 is lower than one. Since the Q value of the first coil La, in which it is difficult to have a high Q value because of low inductance, is set to a value equal or substantially equal to the Q value of the second coil Lb in the impedance transformer 204C, it is possible to use the impedance transformer 204C as an impedance transformer with low insertion loss.

In the impedance transformer 204D in FIG. 12D, the first coil La is connected to the first terminal pair P1 and the second coil Lb is connected to the second terminal pair P2. The impedance transformer 204B illustrated in FIG. 12B is an unbalanced circuit while the impedance transformer 204D illustrated in FIG. 12D is a balanced circuit. The impedance transformation ratio of the impedance transformer 204D is Na:Nb where the number of turns of the second coil Lb is denoted by Nb and the number of turns of the first coil La is denoted by Na. In this example, Na<Nb and the impedance transformation ratio from the first terminal pair P1 to the second terminal pair P2 exceeds one. Since the Q value of the first coil La, in which it is difficult to have a high Q value because of low inductance, is set to a value equal or substantially equal to the Q value of the second coil Lb also in the impedance transformer 204D, it is possible to use the impedance transformer 204D as an impedance transformer with low insertion loss.

Fifth Preferred Embodiment

A coil device defining and functioning as an impedance transformer will be exemplified in a fifth preferred embodiment of the present invention.

FIG. 13 is a circuit diagram of an impedance transformer 205 according to the fifth preferred embodiment. The impedance transformer 205 includes the first coil La and the second coil Lb. The first coil La is magnetically coupled to the second coil Lb.

In the impedance transformer 205, a series circuit of the second coil Lb and the first coil La is connected to the first terminal pair P1 and the first coil La is connected to the second terminal pair P2. In other words, the first coil La and the second coil Lb define an autotransformer. The impedance transformation ratio from the first terminal pair P1 to the second terminal pair P2 is lower than one in the impedance transformer 205. In other words, current flowing through the first coil La is larger than current flowing through the second coil Lb. Since the Q value of the first coil La is at the higher side in the impedance transformer 205, it is possible to use the impedance transformer 205 as an impedance transformer with low insertion loss.

Sixth Preferred Embodiment

Radio-frequency modules each including a filter and an amplifier will be exemplified in a sixth preferred embodiment of the present invention.

FIGS. 14A and 14B are block diagrams of radio-frequency modules 400A and 400B according to the sixth preferred embodiment, respectively. The radio-frequency modules 400A and 400B are examples of a "circuit element module".

The radio-frequency module 400A is connected between an output unit of a transmission circuit Tx and an antenna ANT. The radio-frequency module 400A includes a filter that transmits a signal in a transmission frequency band and an amplifier PA that performs power amplification of a transmission signal.

The radio-frequency module 400B is connected between the antenna ANT and a reception circuit Rx. The radio-frequency module 400B includes an amplifier LNA that performs low noise amplification of a reception frequency and a filter that transmits a signal in a reception frequency band.

Each of the filters described above include the coil device described in, for example, the first preferred embodiment, the second preferred embodiment, or the third preferred embodiment. The radio-frequency module may include the coil device and an active circuit element that are integrally provided in a single package in the above manner.

Seventh Preferred Embodiment

An electronic device, such as a communication terminal, including a coil device or a circuit element module will be exemplified in a seventh preferred embodiment of the present invention.

FIG. 15 is a block diagram of an electronic device 500 according to the seventh preferred embodiment. The electronic device 500 of the present preferred embodiment includes an antenna 1, an antenna matching circuit 40, a communication circuit 51, a baseband circuit 52, an application processor 53, and an input-output circuit 54. The communication circuit 51 includes a transmission circuit TX and a reception circuit RX for a low band (for example, a band from about 700 MHz to about 900 MHz) and a high band (for example, a band from about 1.7 GHz to about 2.7 GHz) and an antenna duplexer. The antenna 1 is, for example, a monopole antenna, a reverse L-shaped antenna, or a reverse F-shaped antenna, which supports the low band and the high band.

The above components are housed in one housing. For example, the antenna matching circuit 40, the communication circuit 51, the baseband circuit 52, and the application processor 53 are mounted on a printed wiring board and the printed wiring board is housed in the housing. The input-output circuit 54 is incorporated in the housing as a display-touch panel. The antenna 1 may be mounted on the printed wiring board or may be arranged on an inside face of the housing or in the housing.

The antenna matching circuit 40 includes, for example, the coil device defining and functioning as an impedance transformer described in the fifth preferred embodiment. The filter in the communication circuit 51 includes, for example, the circuit element module, which is the filter, described in the third preferred embodiment and so on.

With the above configuration, the electronic device including the filter having certain frequency characteristics and an impedance matching circuit with low insertion loss is obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil device comprising:
a first terminal pair;
a second terminal pair;
a first coil connected in series between the first terminal pair and the second terminal pair and including a first coil conductor wound around a winding axis; and
a second coil connected in parallel between the first terminal pair and the second terminal pair, including a second coil conductor wound around the winding axis, and magnetically coupled to the first coil; wherein
an area of the first coil conductor is larger than an area of the second coil conductor when the coil device is viewed in a direction of the winding axis.

2. The coil device according to claim 1, further comprising:
a capacitor connected in series to the second coil; wherein
the coil device defines an attenuation pole in a frequency characteristic.

3. The coil device according to claim 1, further comprising:
a capacitor connected in parallel to the first coil; wherein
the coil device defines an attenuation pole in a frequency characteristic.

4. The coil device according to claim 1, wherein a line width of the first coil conductor is greater than a line width of the second coil conductor.

5. The coil device according to claim 1, wherein the first coil conductor has a spiral shape and the second coil conductor has a helical shape.

6. A circuit element module comprising:
the coil device according to claim 1; and
an active circuit element connected to the first coil or the second coil; wherein
the coil device and the active circuit element are integrally configured in a single package.

7. An electronic device comprising:
the coil device according to claim 1; and
another circuit connected to the coil device.

8. An electronic device comprising:
the circuit element module according to claim 6; and
another circuit connected to the circuit element module.

9. A coil device comprising:
a first terminal pair;
a second terminal pair;
a first coil connected in parallel between the first terminal pair and the second terminal pair and including a first coil conductor wound around a winding axis; and
a second coil connected in series between the first terminal pair and the second terminal pair, including a second coil conductor wound around the winding axis, and magnetically coupled to the first coil; wherein
an area of the first coil conductor is larger than an area of the second coil conductor when the coil device is viewed in a direction of the winding axis.

10. The coil device according to claim 9, wherein
the first coil is connected to the second coil; and
the first coil and the second coil define an impedance transformation circuit.

11. The coil device according to claim 9, further comprising:
a capacitor connected in series to the second coil; wherein
the coil device defines an attenuation pole in a frequency characteristic.

12. The coil device according to claim 9, further comprising:
a capacitor connected in parallel to the first coil; wherein
the coil device defines an attenuation pole in a frequency characteristic.

13. The coil device according to claim 9, wherein a line width of the first coil conductor is greater than a line width of the second coil conductor.

14. The coil device according to claim 9, wherein the first coil conductor has a spiral shape and the second coil conductor has a helical shape.

15. A circuit element module comprising:
the coil device according to claim 9; and
an active circuit element connected to the first coil or the second coil; wherein
the coil device and the active circuit element are integrally configured in a single package.

16. An electronic device comprising:
the coil device according to claim 9; and
another circuit connected to the coil device.

* * * * *